DEFENSIVE PUBLICATION

UNITED STATES PATENT OFFICE

Published at the request of the applicant or owner in accordance with the Notice of Dec. 16, 1969, 869 O.G. 687. T abstracts of Defensive Publication applications are identified by distinctly numbered series and are arranged chronological The heading of each abstract indicates the number of pages of specification, including claims and sheets of drawings contain in the application as originally filed. The files of these applications are available to the public for inspection and reproducti may be purchased for 30 cents a sheet.

Defensive Publication applications have not been examined as to the merits of alleged invention. The Patent Office mak no assertion as to the novelty of the disclosed subject matter.

PUBLISHED JULY 28, 1970

876 O.G. 816

T876,010

PHOTOGRAPHIC ELEMENT FOR PRINTING PLATES HAVING A DIAZO RESIN AND A LOW CONCENTRATION OF POLYVINYL ACETAL OF 2,4-DISULFOBENZALDEHYDE

Frederick J. Rauner and Donald A. Smith, both % Kodak Park Works, Rochester, N.Y. 14650

Filed Feb. 2, 1970, Ser. No. 8,061
Int. Cl. E03c *1/52, 1/58, 5/22*
U.S. Cl. 96—49
No Drawing. 10 Pages Specification Photographic elements useful as positive-working planographic printing plates and having a hydrophobic, ink-receptive support coated with a light-sensitive hydrophilic layer including a diazo resin and a hydrophilic polymer can be prepared with low polymer concentrations by employing a polyvinylacetal of 2,4-disulfobenzaldehyde as the hydrophilic polymer.